United States Patent

Wen

[11] Patent Number: 5,949,116
[45] Date of Patent: Sep. 7, 1999

[54] MOS DEVICE HAVING A SOURCE/DRAIN REGION CONFORMING TO A CONDUCTIVE MATERIAL FILLED FRENCH STRUCTURE IN A SUBSTRATE

[75] Inventor: Jemmy Wen, Hsinchu, Taiwan

[73] Assignee: United Microelectronics Corp., Taiwan

[21] Appl. No.: 08/888,630

[22] Filed: Jul. 7, 1997

Related U.S. Application Data

[62] Division of application No. 08/751,297, Oct. 31, 1996, Pat. No. 5,786,257.

[51] Int. Cl.⁶ ........................................... H01L 7/54
[52] U.S. Cl. .................... 257/408; 257/288; 257/236; 257/396; 257/397; 257/398; 257/399; 257/400; 257/344; 438/300; 438/262; 438/301; 438/305; 438/390
[58] Field of Search ...................... 257/288, 336, 257/382, 386–398, 399, 400, 344, 408; 438/300, 262, 301, 305, 390

[56] References Cited

U.S. PATENT DOCUMENTS

| | | | |
|---|---|---|---|
| 3,853,633 | 12/1974 | Armstrong | 257/398 |
| 4,135,955 | 1/1979 | Gasner et al. | 257/399 |
| 4,789,644 | 12/1988 | Meda | 438/300 |
| 5,198,378 | 3/1993 | Rodder et al. | 438/300 |
| 5,548,145 | 8/1996 | Hamamoto et al. | 257/301 |

*Primary Examiner*—Fetsum Abraham
*Attorney, Agent, or Firm*—Rabin & Champagne, P.C.

[57] ABSTRACT

A MOS device and method of fabricating the same, wherein the source/drain region has polysilicon trench structure which are formed by self-alignment using silicon oxide layers as masks. The source/drain regions extend to the field oxide layer and/or above the gate. Therefore, contacts can be formed on source/drain conductive regions above the field oxide layer.

8 Claims, 4 Drawing Sheets

MOS DEVICE HAVING A SOURCE/DRAIN REGION CONFORMING TO A CONDUCTIVE MATERIAL FILLED FRENCH STRUCTURE IN A SUBSTRATE

This is a Division of application Ser. No. 08/751,297, filed Oct. 31, 1996 U.S. Pat. No. 5,786,257.

BACKGROUND OF THE INVENTION

1. Field of the Invention

The invention relates in general to an integrated circuit (IC) and its fabrication, and more particularly to a high density metal-oxide-semiconductor (MOS) device and a process for its fabrication.

2. Description of the Related Art

For the present requirements for lighter, thinner, shorter, and smaller memory devices, it is of great interest to develop high density MOS devices. Referring first to FIG. 1, which is a cross-sectional view of a conventional MOS device, a method of fabricating this conventional MOS device is briefly described as follows: An active region is first defined on a substrate 100 by forming a field oxide 101. Next, a gate oxide layer 104, a gate 103, source/drain regions 102 and spacers 105 are formed in the active region to provide a MOS device, wherein the source/drain regions 102 are formed by ion implantation and diffusion. An insulating layer 107 for planarization is then deposited, and a contact opening 106 is formed in the insulating layer 107 above the source/drain regions. Finally, metalization is performed by filling the contact opening 106 with aluminum 108. However, the MOS device as shown in FIG. 1 has the following drawbacks:

1. Since the source/drain regions are typically formed by ion implantation and also due to the short channel effect, it is difficult to minimize the size of the device by reducing the length of the channel.

2. The contact openings are formed on the source/drain regions. Therefore, a leakage path may develop in the source/drain regions because of a misalignment of the mask.

3. The minimum distance between the edge of the contact window and the edge of the gate can not be less than a certain amount. Therefore, since the contact windows must be formed on the source/drain regions, the degree to which the device size can be reduced is again limited.

SUMMARY OF THE INVENTION

It is therefore an object of the invention to provide a process for fabricating a MOS device, which allows the contact window elsewhere than on the source/drain regions but over the field oxide layer. As a result, the device is reduced in size.

It is another object of the invention to provide a MOS device and a process of its fabrication which uses trenches as to form the source/drain regions in order to reduce the size of the device.

The invention achieves the above-identified objects by providing a MOS device formed in an active region of a substrate, wherein source/drain regions are formed inside the substrate and extending to a field oxide layer surrounding the active region. The substrate is etched by self-alignment to form two trenches opposite sides of and adjacent to the gate. Then, an insulating layer is formed on the surface of each trench but limited to below a lightly doped region. Highly doped polysilicon is next used to fill each trench and also extends onto the field oxide layer and/or above the gate. The highly doped polysilicon therefore serves to form source/drain regions.

BRIEF DESCRIPTION OF THE DRAWINGS

Other objects, features, and advantages of the invention will become apparent from the following detailed description of the preferred but non-limiting embodiments, with reference to the accompanying drawings in which.

DESCRIPTION OF THE PREFERRED EMBODIMENT

Figure 1:
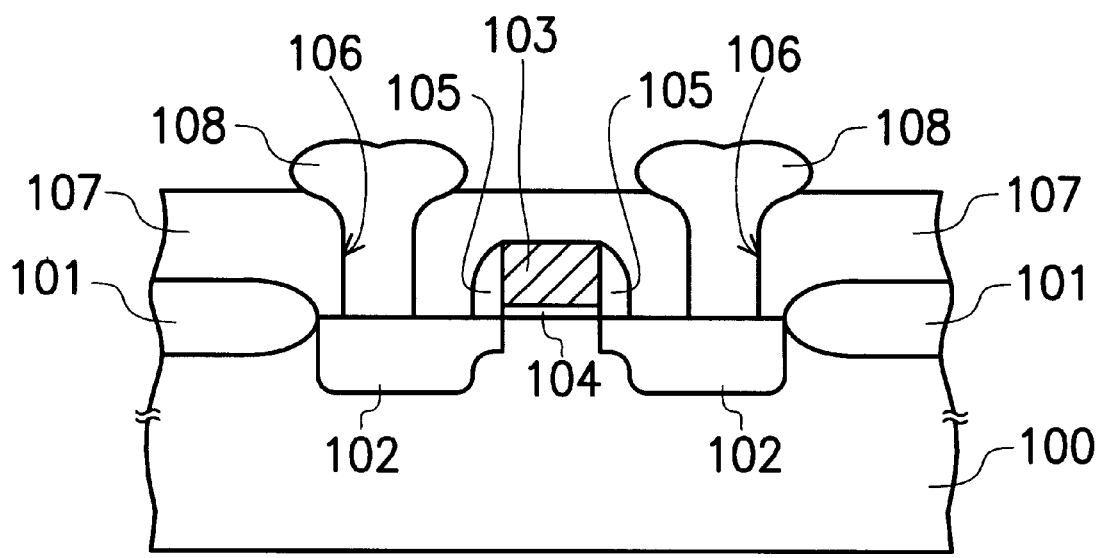
FIG. 1 is a cross-sectional view showing a conventional MOS device.
Figure 2A:
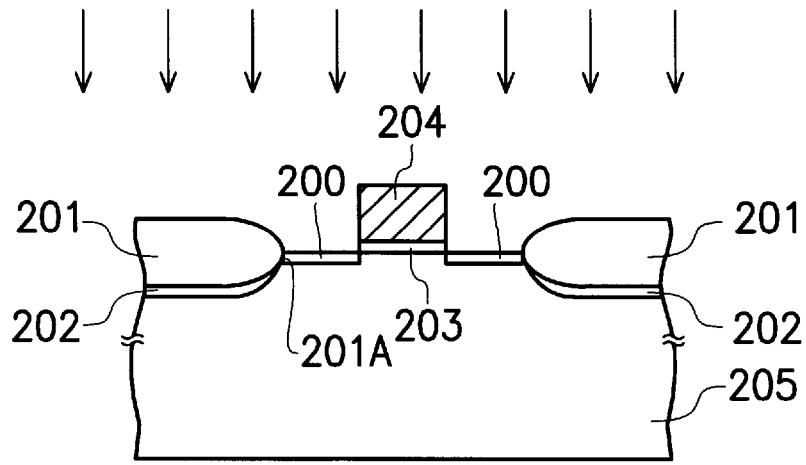
FIGS. 2A to 2F are cross-sectional views showing the steps of forming a MOS device according to a preferred embodiment of the invention.

Referring first to FIG. 2A, on a substrate 205, for example, a P-type substrate, a pad oxide layer (not shown) is formed and then a silicon nitride layer (not shown) is formed. The silicon nitride layer is then patterned, using a photoresist, to define therebeneath what will subsequently become an active region. The patterned silicon nitride layer is used primarily as a mask for local oxidation, to pattern the active region. P-type dopant, such as boron ion, is then implanted and diffused by high heat, into the exposed part of the substrate 205 so as to form a channel stop 202. The photoresist is removed, and then an insulating layer 201 is formed, for example, by thermal oxidation, to provide a field oxide with a bird's beak structure defining an opening 201A that exposes the active region. Then the silicon nitride layer and the pad oxide layer are removed to define the active region. This is followed by formation of a gate oxide layer 203 and a gate 204, in order, on the substrate 205. Next, a dopant, such as phosphorous ion, is implanted in the substrate 205 to form lightly doped region, such as an N⁻diffusion region 200, as shown in FIG. 2A.

Figure 2B:
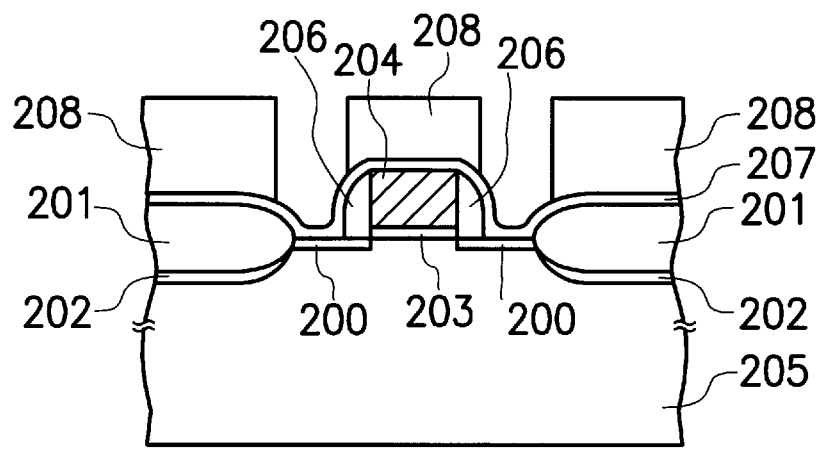

Referring next to FIG. 2B, spacers 206 are formed on the sides of the gate oxide 203 and the gate 204, preferably by using chemical vapor deposition to form a oxide layer and then etching back. Next, an insulating layer 207 is deposited as a protection layer over the gate 204, and the oxide layers 201 and 206 in the continuing process. The insulating layer 207 can be an oxide layer or a silicon nitride layer. However, it is preferably to use a silicon nitride layer in order to avoid its removal during a later wet etching step. Then, a photoresist layer 208 is formed with openings on the insulating layer 207 which define the locations of source/drain regions.

Figure 2C:
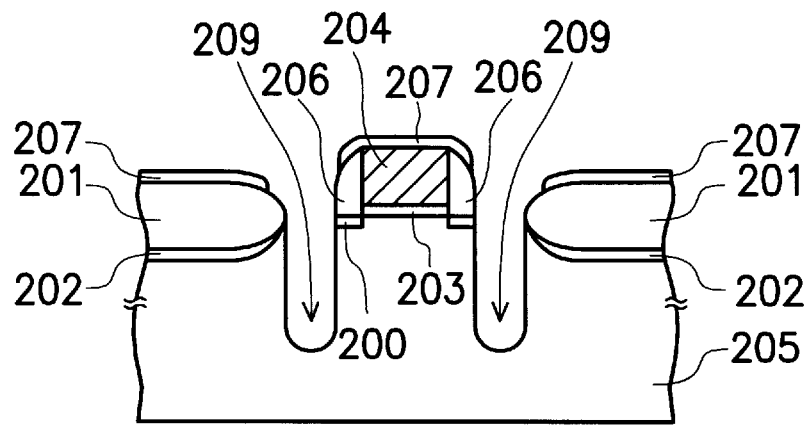

Referring to FIG. 2C, the insulating layer 207 is etched by using the patterned photoresist layer 208 as a mask. Then, the substrate 205 is dry etched which using the insulating layer 201 and the spacers 206 as masks. Subsequently, two trenches 209 are formed by self-alignment, after which, the photoresist 208 is removed.

Figure 2D:
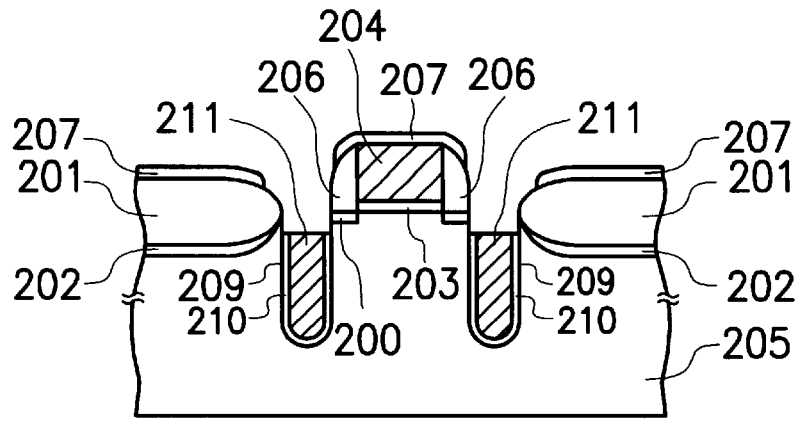

Next, referring to FIG. 2D, an insulating layer 210, preferably an oxide layer formed by thermal oxidation, is provided on the surface of the trench 209. Then, a conductive material is deposited on the exposed surface of the insulating layer 210. The conductive material is preferably a highly doped polysilicon formed by chemical vapor deposition (CVD). Then, part of the conductive material is removed by etching back until a conductive layer 211 remains, whose upper surface is substantially lower than the top surface of the substrate 205. Next, a part of the exposed insulating layer 210 is removed by wet etching ,as by the use of hydrofluoric acid, leaving an exposed vertical surfaces of the substrate 205 in the trenches 209 below the N⁻diffusion layer 200.

Figure 2E:
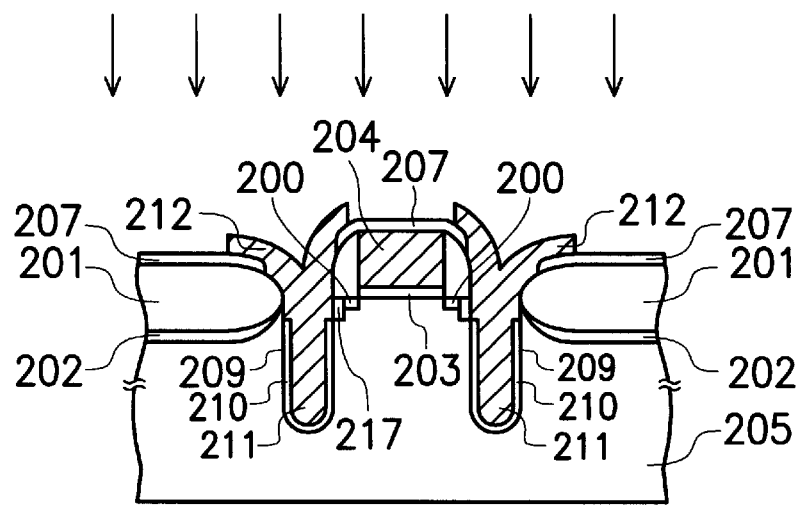
Figure 3:
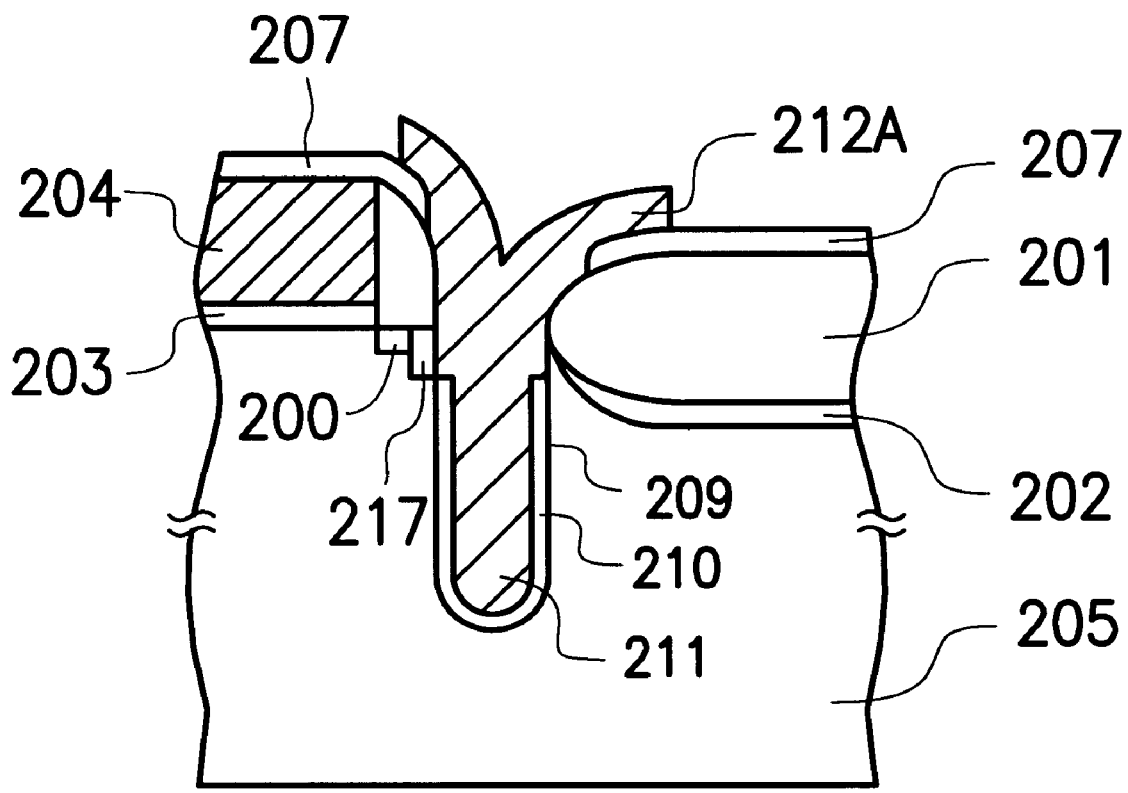
FIG. 3 is a cross-sectional view showing a portion of a MOS device according to an alternative preferred embodiment of the invention.

Referring to FIG. 2E, a conductive layer 212, formed for example, of highly doped polysilicon, is deposited and patterned so as to remain on and adjacent to the upper surface of the conductive layer 211, so as to fill the trench 209 and cover an exposed surface of the field oxide layer 201. In an alternative embodiment, the conductive layer 212A also extends over part of the gate 204, as illustrated in FIG. 3. In a further embodiment (not shown) the conductive layer 212 may extend over part of the gate 204 but not the field oxide layer 201. The highly concentrated dopant in the conductive layer 212 diffuses into the substrate 205 to form a highly concentrated diffusion region, such as the N⁺diffusion region 217 shown in the figure. The diffusion takes place because there is a junction between the highly doped conductive layer 212 and the substrate 205, in the area between the upper surface of the conductive layer 211 and the top surface of the substrate 205. This completes the formation of source/drain regions. In accordance with the preferred embodiment, the source/drain region includes the insulating layer 210, the conductive layer 211, the other conductive layer 212, the N⁺diffusion region 217, and the lightly doped region 200.

Figure 2F:
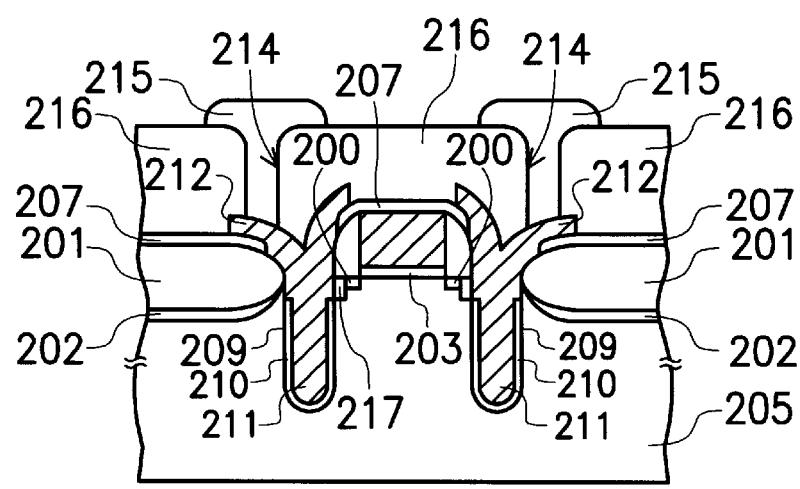

Referring to FIG. 2F, an insulating layer 216 for planarization is now formed on the surface of the wafer. The material of the insulating layer 216 can be, for example, borophosphosilicate (BPSG). Next, a contact opening 214 is formed in the insulating layer 216 by photolithography, so that the bottom of the contact opening 214 exposes the conductive layer 212 above the field oxide layer 201. In an alternative embodiment, the contact opening is formed above the gate 204. Then, a metal such as aluminum is used to fill the contact opening 214 to form a contact window 215. Further processes for the completion of the memory device are not related to invention, so that these description is accordingly omitted.

The invention provides the following advantages:

1. The integration of the MOS device is substantially increased since the contact opening is formed above the field oxide layer or the gate.
2. A leakage path will not be formed even if there is a misalignment of the masks, since the location of the contact opening is above the field oxide layer or the gate.
3. The integration of the MOS device is further increased since each source/drain region is formed by filling a trench with conductive material, but not by ion implantation, so the size of source/drain region can be minimized without creating short channel effect.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate having an active region;
   an insulating layer surrounding the active region; and
   a MOS device in said active region, the MOS device including:
      a gate on the active region; and
      a source/drain region comprising a trench structure formed in said substrate and a single conductive layer filling said trench structure and extending over and onto the insulating layer.

2. A structure according to claim 1, wherein the conductive layer is a highly doped polysilicon layer.

3. A structure according to claim 1, wherein said insulating layer comprises a field oxide layer.

4. A structure according to claim 1, wherein said source/drain region extends over, onto, and in physical contact with the insulating layer.

5. A structure according to claim 4, further comprising a metal contact that is in physical contact with said source/drain region.

6. A semiconductor structure, comprising:
   a substrate having an active region;
   an insulating layer surrounding the active region; and
   a MOS device in said active region, the MOS device including:
      a gate on the active region; and
      a source/drain region in the substrate and including:
         a first portion located to a side of the insulating layer and extending in a generally vertical direction, the first portion including an insulating layer located on a surface of a trench, and a conductive material deposited in the trench and on a surface of the insulating layer, and
         a second portion that extends on top of, in a generally horizontal direction, and in physical contact with the insulating layer, the second portion including further conductive material in physical contact with the first portion.

7. A structure according to claim 6, wherein the insulating layer is a field oxide layer.

8. A structure according to claim 6, further comprising a metal contact that is in physical contact with said source/drain region.

* * * * *